(12) United States Patent
Chung

(10) Patent No.: US 9,176,399 B2
(45) Date of Patent: Nov. 3, 2015

(54) COMPONENT OF AN EUV OR UV LITHOGRAPHY APPARATUS AND METHOD FOR PRODUCING IT

(75) Inventor: Hin Yiu Anthony Chung, Elchingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 153 days.

(21) Appl. No.: 13/360,374

(22) Filed: Jan. 27, 2012

(65) Prior Publication Data
US 2012/0120378 A1 May 17, 2012

Related U.S. Application Data

(63) Continuation of application No. PCT/EP2009/005513, filed on Jul. 30, 2009.

(51) Int. Cl.
| | | |
|---|---|---|
| G03B 27/52 | (2006.01) |
| G03B 27/68 | (2006.01) |
| G03F 7/20 | (2006.01) |
| B29D 11/00 | (2006.01) |
| B82Y 10/00 | (2011.01) |
| B82Y 40/00 | (2011.01) |
| G02B 7/00 | (2006.01) |

(Continued)

(52) U.S. Cl.
CPC ........ *G03F 7/70916* (2013.01); *B29D 11/0073* (2013.01); *B82Y 10/00* (2013.01); *B82Y 40/00* (2013.01); *G02B 7/00* (2013.01); *G03F 1/14* (2013.01); *G03F 1/24* (2013.01); *G03F 1/38* (2013.01); *G03F 7/70783* (2013.01); *G03F 7/70808* (2013.01); *G03F 7/70825* (2013.01); *G03F 7/70841* (2013.01); *G21K 2201/067* (2013.01); *Y10T 156/10* (2015.01)

(58) Field of Classification Search
CPC ............ G03F 7/70833; G03F 7/70825; G03F 7/70958
USPC .................................. 355/30, 52; 156/60, 285
See application file for complete search history.

(56) References Cited

U.S. PATENT DOCUMENTS

| | | | |
|---|---|---|---|
| 4,778,253 A | * | 10/1988 | Siga ........................ G02B 7/025 156/89.15 |
| 6,144,504 A | | 11/2000 | Sudoh et al. |

(Continued)

FOREIGN PATENT DOCUMENTS

| | | |
|---|---|---|
| JP | 11014876 A | 1/1999 |
| JP | 11211958 | 8/1999 |

(Continued)

OTHER PUBLICATIONS

Machine translation of JP 11-014876 A.*

*Primary Examiner* — Deoram Persaud
(74) *Attorney, Agent, or Firm* — Edell, Shapiro & Finnan, LLC

(57) ABSTRACT

To improve the bonding of two parts (401, 403) of a component (400) of an EUV or UV lithography apparatus such that the probability of occurrence of additional stress over time in the bonded parts (401, 403) is lessened, a component (400) of an EUV or UV lithography apparatus comprising two parts (401, 403) bonded to each other by adhesive material (405) is proposed, wherein the adhesive material (405) is coated with a protective layer (407) insulating the adhesive material (405) from the surrounding gas environment.

16 Claims, 5 Drawing Sheets

(51) Int. Cl.
*G03F 1/00* (2012.01)
*G03F 1/24* (2012.01)
*G03F 1/38* (2012.01)

(56) References Cited

U.S. PATENT DOCUMENTS

| | | | |
|---|---|---|---|
| 6,627,365 | B1 | 9/2003 | Shiraishi |
| 6,869,733 | B1 | 3/2005 | Su |
| 7,006,286 | B2 * | 2/2006 | Satake .................. G02B 1/105 156/101 |
| 8,081,554 | B2 * | 12/2011 | Tojo .................. G02B 27/0037 369/112.22 |
| 8,179,944 | B2 * | 5/2012 | Anzellotti .............. G02B 1/105 359/350 |
| 2002/0128539 | A1 | 9/2002 | Higuma et al. |
| 2006/0033984 | A1 | 2/2006 | Bruynooghe et al. |
| 2008/0210020 | A1 | 9/2008 | Bieck et al. |
| 2008/0259230 | A1 * | 10/2008 | Miyakita ............ B29D 11/0073 349/8 |
| 2008/0310020 | A1 * | 12/2008 | Hashimoto et al. ........... 359/485 |
| 2009/0002674 | A1 * | 1/2009 | Kawanami ............. G03B 27/72 355/71 |
| 2011/0116060 | A1 * | 5/2011 | Dziomkina ......... G03F 7/70341 355/30 |
| 2011/0199592 | A1 * | 8/2011 | De Graff ............. G03F 7/70341 355/30 |

FOREIGN PATENT DOCUMENTS

| | | |
|---|---|---|
| JP | 2000139819 A | 5/2000 |
| JP | 2009009100 A | 1/2009 |
| WO | 9949366 A1 | 9/1999 |

* cited by examiner

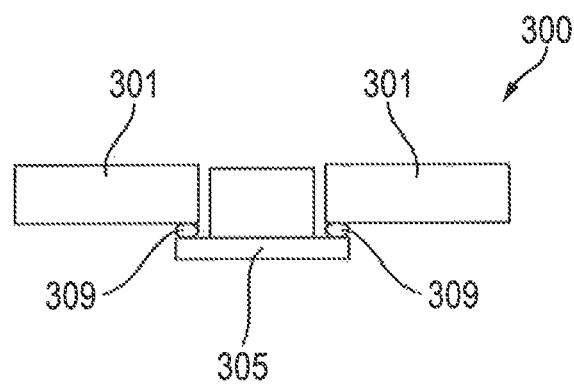
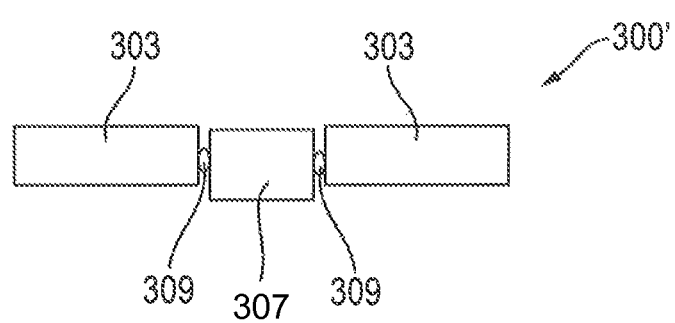
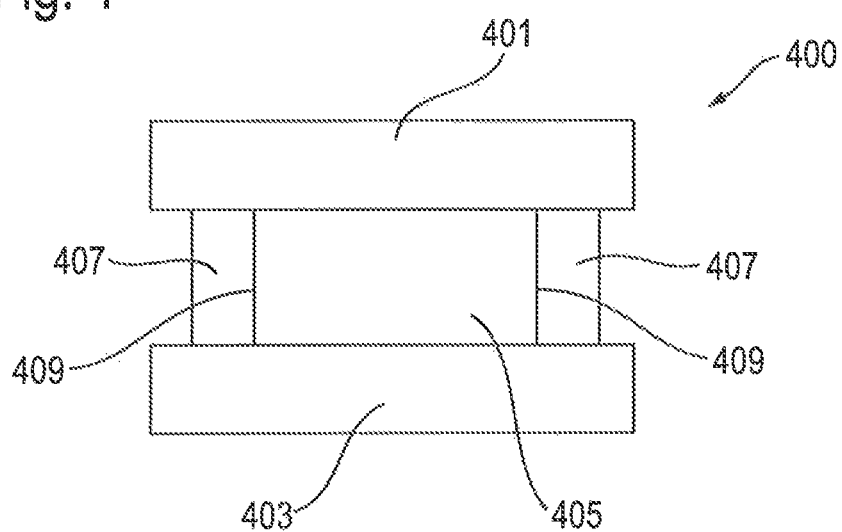

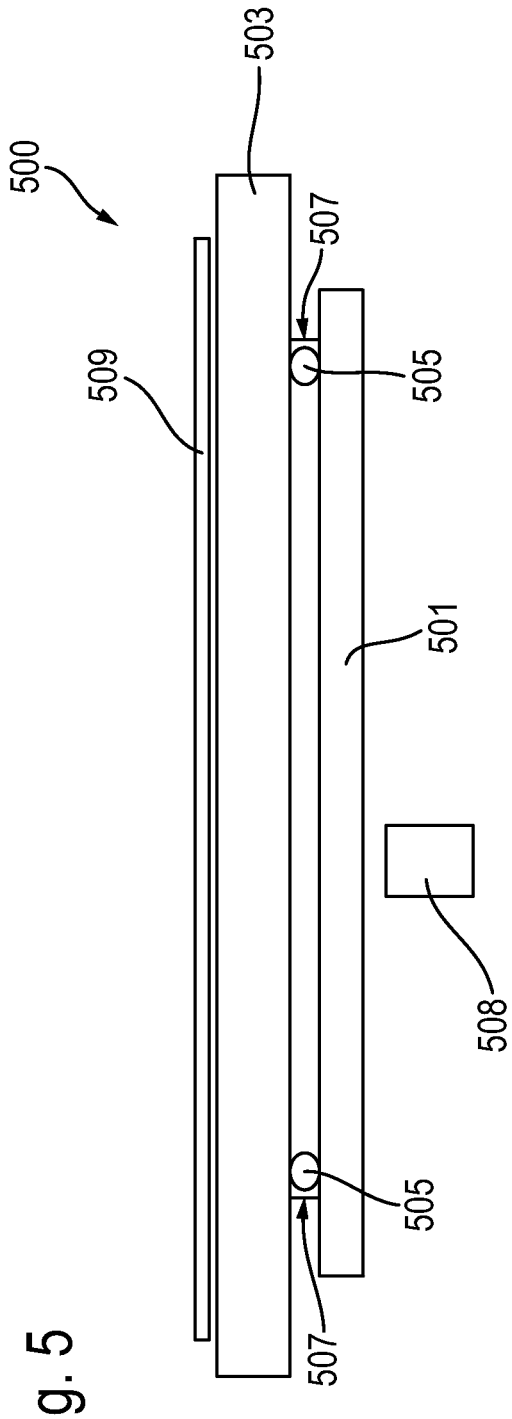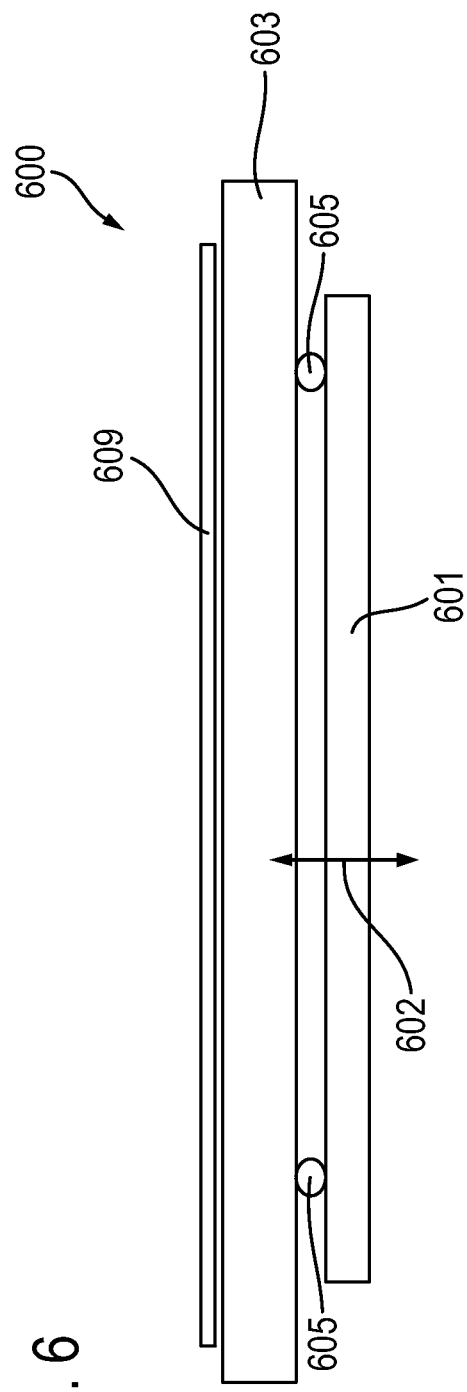

COMPONENT OF AN EUV OR UV LITHOGRAPHY APPARATUS AND METHOD FOR PRODUCING IT

CROSS REFERENCE TO RELATED APPLICATIONS

This is a Continuation of International Application PCT/EP2009/005513, with an international filing date of Jul. 30, 2009, which was published under PCT Article 21(2) in English, and the entire contents of which are hereby incorporated by reference.

FIELD AND BACKGROUND OF THE INVENTION

The present invention relates to a component of an EUV or UV lithography apparatus comprising two parts bonded to each other by adhesive material, as well as to a projection system for an EUV or UV lithography apparatus and an EUV or UV lithography apparatus comprising such a component. The present invention further relates to a method for producing such a component.

EUV lithography apparatuses, i.e. lithography apparatuses working in an extreme ultraviolet wavelength range of approximately 1 nm to 20 nm, as well as UV lithography apparatuses, i.e. lithography apparatuses working in an ultraviolet wavelength range of approximately 20 nm to 400 nm are mainly used for the production of semiconductor devices. In lithography, a mask is illuminated, and the structure of the mask is projected onto a wafer coated with photo resist.

Some parts of lithography apparatuses such as mirrors, lenses, masks and others are mounted in holders or mountings and are often bonded by using an adhesive material. It has been noticed that, depending on the environment in which the component having two adhesively bonded parts is utilized, the bonding may show deformation variations over time: When controlling the deformation of the bonded parts, especially near the bonding, over a longer lapse of time, a drift may often be observed. In particular, if one of the bonded parts is an optical element, its optical properties may be deteriorated by the stress.

OBJECTS AND SUMMARY OF THE INVENTION

It is an object of the invention to improve the bonding of two parts of a component of an EUV or UV lithography apparatus such that the probability of occurrence of additional stress over time in the bonded parts is lessened.

In a first aspect of the present invention, this object is achieved by a component of an EUV or UV lithography apparatus, comprising two parts bonded to each other by adhesive material, wherein the adhesive material is coated with a protective layer insulating the adhesive material from the surrounding gas environment.

By insulating at least partly the surface of the adhesive material between the bonded parts that is exposed to the surrounding gas environment, the influence of the gas environment can be decreased. Gases in the surrounding environment, that are apt to be absorbed by the adhesive material, thus causing expansion or degradation of the adhesive material, have a much lesser probability of reaching the adhesive material. Gases in the adhesive material that could outgas, thus causing shrinking of the adhesive material, have a much lesser probability of outgassing, due to the protective layer. The shrinking or expansion or degradation of the adhesive material could otherwise lead to additional stress in the bonded parts, depending on the particular composition of the surrounding gas environment. It will be noted that in addition to the adhesive bonding further bonding methods and structures may be utilized.

In a second aspect of the present invention, the object is achieved by a projection system for an EUV or UV lithography apparatus comprising a component as explained.

In particular in the projection system, the tolerance ranges for the optical characteristics are quite tight to accurately project the structure of an illuminated mask on a wafer. By avoiding additional stress due to expansion or shrinking or degradation of the adhesive material used for bonding parts of components of the projection system, these tolerance ranges may be easier to control.

In a third aspect of the present invention, the object is achieved by an EUV or UV lithography apparatus including a component as explained, thus allowing for a higher precision of the lithography process.

In a fourth aspect of the present invention, the object is achieved by a method for producing a component as explained, which includes:
bonding two parts with an adhesive material;
depositing a protective layer on the adhesive material still exposed to the surrounding gas environment.

By depositing a protective layer on the adhesive material after bonding, at least part of the surface of adhesive material that would otherwise be exposed to the surrounding gas environment after bonding is insulated by the protective layer, thus reducing the influence of the surrounding gas environment on the adhesive material, which could otherwise lead to additional and time-varying stress in the bonded parts. Components for EUV or UV lithography apparatuses produced according to this method allow for lithography apparatuses and projection systems for EUV or UV lithography with high precision.

Preferred embodiments are described in the dependent claims.

BRIEF DESCRIPTION OF THE DRAWINGS

A detailed description of the invention is provided below. The description is provided by way of non-limiting examples, to be read with reference to the attached drawings in which:

FIGS. 3a, b illustrate schematically the bonding of a mirror or lens in a mounting;

FIG. 4 illustrates schematically an embodiment of a component of adhesively bonded parts with protective layer;

FIG. 5 illustrates schematically a scale adhesively bonded to a mounting with protective layer;

FIG. 6 illustrates schematically a scale adhesively bonded to a mounting without protective layer;

DETAILED DESCRIPTION

Figure 1:
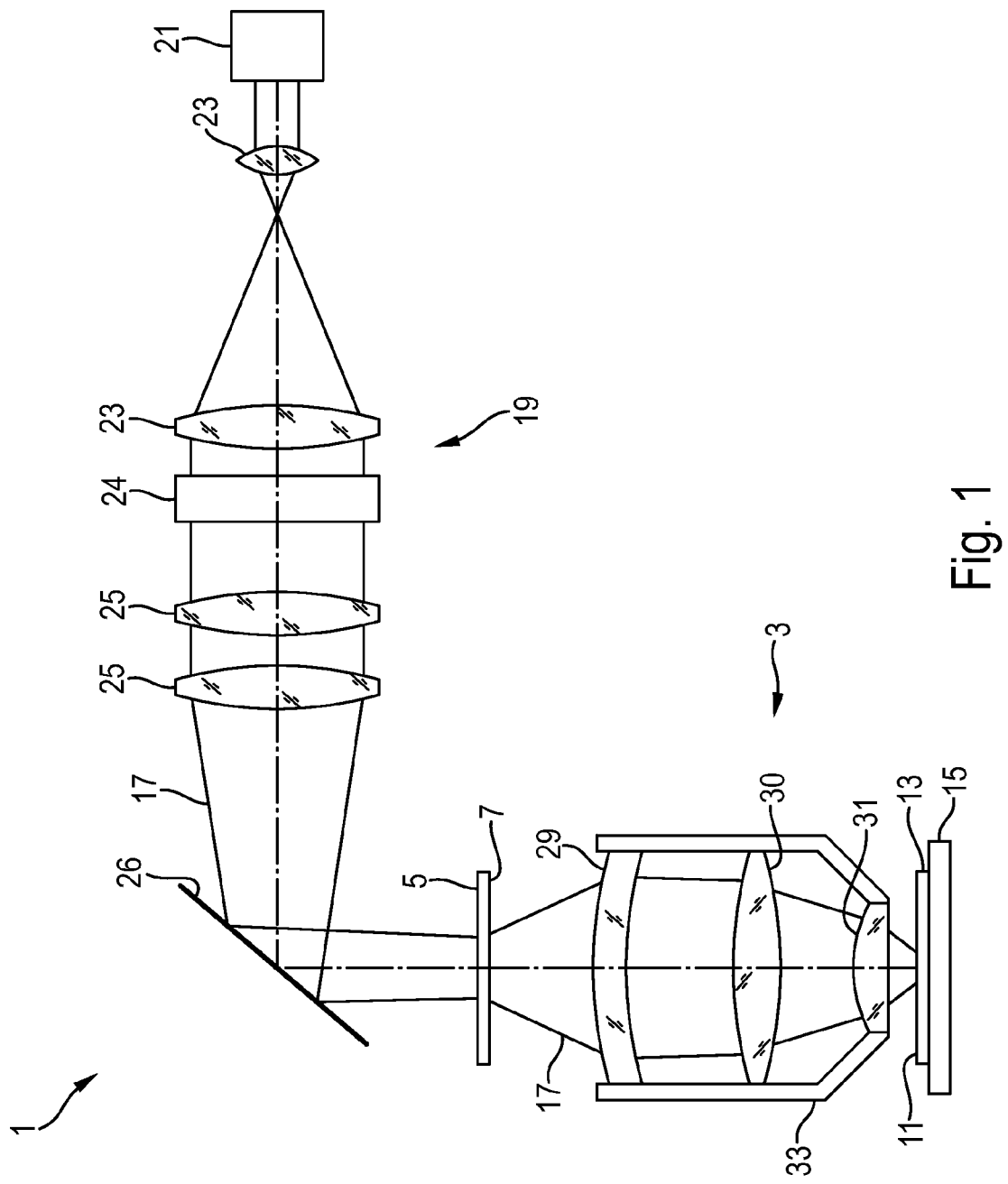
FIG. 1 illustrates schematically an embodiment of a UV lithography apparatus.

FIG. 1 shows schematically a UV lithography apparatus 1. The UV lithography apparatus 1 comprises a light source 21 with condenser lens 23. Preferred light sources are lasers emitting light at e.g. 365 nm, 268 nm or 193 nm. With help of the illuminating system 19 comprising lenses 23, 24, 25 and mirror 26 in the present example, the photomask 7 having some defined structure is illuminated. Then the structure of the photomask 7 is projected by projection system 3 onto the wafer 13 coated with photoresist 11. The projection system 3 comprises lenses 29, 30, 31 in the housing 33.

Figure 2:
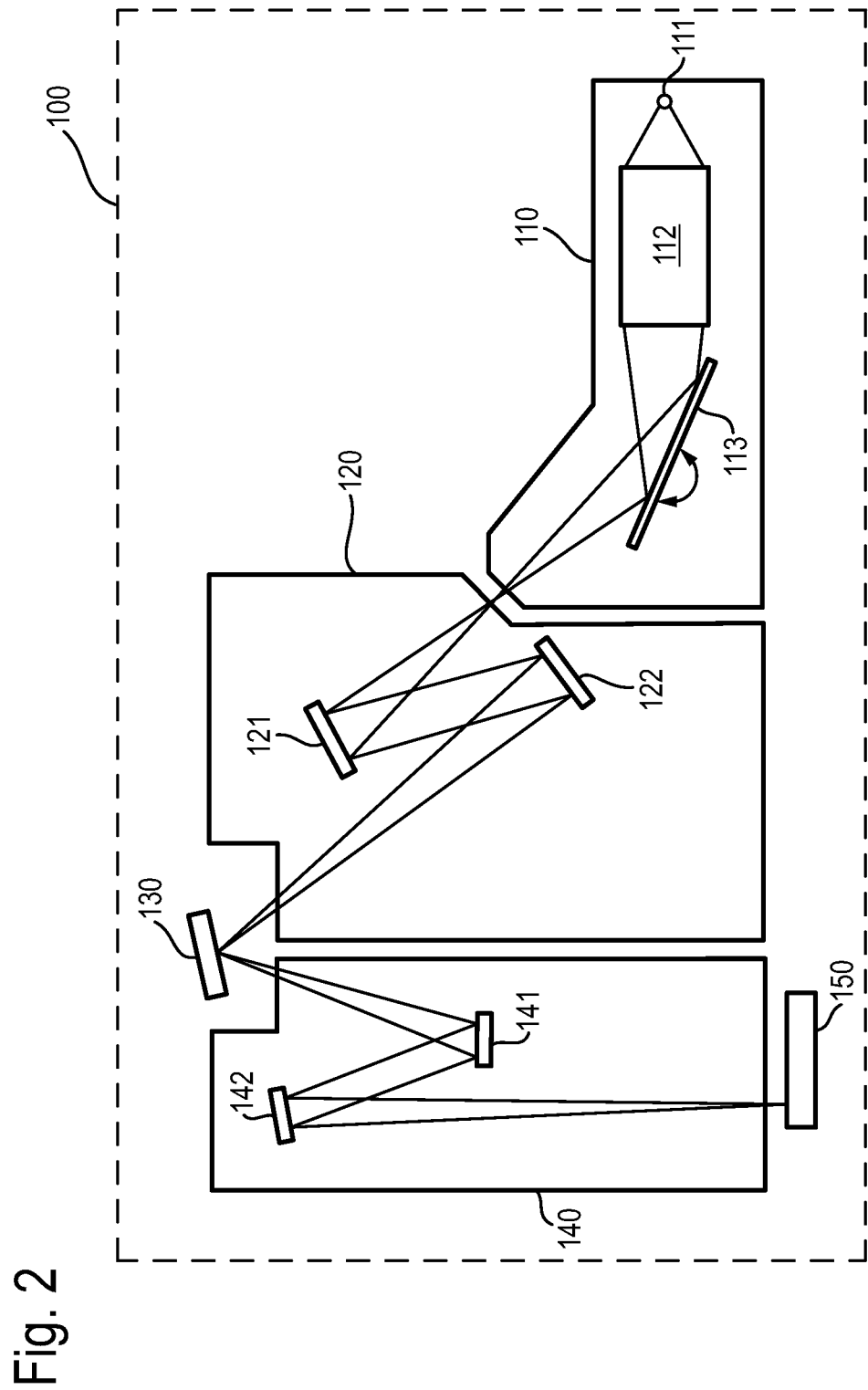
FIG. 2 illustrates schematically an embodiment of an EUV lithography apparatus.

FIG. 2 shows schematically an EUV lithography apparatus 100. Its main components are the beam shaping system 110, the illumination system 120, the reticle 130 and the projection system 140. The EUV source 111 may be a plasma source or a synchrotron. The radiation of the EUV source 111 has a wavelength in the range of about 1 nm to 20 nm. In the beam shaping system 110, the radiation is collimated in the collimator 112. Then, the monochromator 113 filters the desired wavelength needed for illuminating the reticle 130 and projecting its structure onto the wafer 150 by varying the angle of incidence of the collimated beam. In the present wavelength range, normally, reflective optical elements such as multilayer mirrors are used as collimator 112 and monochromator 113 for shaping the beam with respect to wavelength and angular distribution. In particular, a collector mirror can be utilized as collimator 112.

The illumination system 120 illuminates the reticle 130, i.e. a mask, the structure of which is projected many times on the same wafer 150 next to one another, with the shaped beam by reflecting it in the present example with the help of two optical elements, in the present example two multilayer mirrors 121, 122. Depending on the specific needs, there can also be only one or three, four, five or more reflective optical elements, if needed.

To be useable with EUV radiation, the reticle 130 is a reflective optical element, too. The beam reflected by the reticle 130, corresponding to the structure of the reticle 130, is projected onto the wafer 150 by the projection system 140 with the help of two multilayer mirrors 141, 142. As in the cases of the illumination system 120, there can be as well only one or three, four, five or more reflective optical elements in the projection system 140, if needed.

In UV lithography apparatus 1 as well as in EUV lithography apparatus 100, there are arranged components that have two parts bonded to each other by adhesive material, wherein the adhesive material is coated with a protective layer insulating the adhesive material from the surrounding gas environment. These components can be located anywhere in the lithography apparatus, in particular in the beam shaping system, in the illumination system, near the wafer or elsewhere, for example in the projection system or next to the mask.

Preferred embodiments of these components are e.g. scales bonded to some support, or mirrors, lenses, masks or wafers bonded to some mounting, such as inter alia lenses 29, 30 or 31 bonded to some mounting in housing 33, mask 7 bonded to some mask holder 5, or wafer 13 bonded to wafer holder 15. In analogous manner, mirrors, masks, wafers or other parts of the EUV lithography apparatus may be bonded to some support or mounting.

FIGS. 3a, b illustrate schematically how e.g. a mirror 301 or a lens 303 of some component 300, 300' may be bonded to some bushing 305, 307 of a mounting. The bushing may have a collar, as shown for bushing 305 bonded to mirror 301. Then the adhesive material 309 may be applied to the collar of the bushing 305 to adhere to the surface of the mirror 301. If the bushing does not have any collar, as shown for bushing 307 bonded to lens 303, the adhesive material 309 may be applied inside the bore of the lens 303.

The mirrors 301 or lenses 303 as well as mask may be made for example of silica, calcium difluoride, magnesium difluoride or glass ceramics, and are adhesively bonded to a mounting made of metal, such as e.g. aluminium or steel. As the material of the mirrors 301 or lenses 303 is much more brittle than metal, there is a much higher risk of additional stress in these parts 301, 303 than in the mounting.

Depending on the gas environment surrounding some component and contacting the adhesive material 309, there may be some interaction of the gas environment and the adhesive material, causing inter alia shrinking or expansion or degradation of the adhesive material, thus generating stress inside bonded parts, especially inside more brittle parts like mirrors, lenses or masks. For example, in a humid environment, the adhesive material may absorb some humidity and expand. In a dry environment, humidity still contained in the adhesive material may desorb, causing the adhesive material to shrink. Analogous processes may be observed in a vacuum environment with the adhesive material absorbing some residual gases or the adhesive material outgassing some gas.

To avoid these processes, after bonding parts 401, 403 of component 400 with adhesive material 405, the surfaces 409 of the adhesive material 405 still subject to exposure to the surrounding gas environment are coated with a protective layer 407 to insulate theses surfaces 409, as illustrated schematically in FIG. 4. Such a protective layer may be applied e.g. on components 300, 300' of FIGS. 3a, b to protect the adhesive bonding and avoid stress especially in the mirror 301 or the lens 303.

It is advantageous to choose the material of the protective layer such that the protective layer has an elasticity modulus of less than 10 MPa to avoid inducing additional stress due to the protective layer itself. Preferred is an elasticity modulus of less than 5 MPa, especially preferred is an elasticity modulus of less than 2 MPa. In particular for components for EUV lithography apparatuses, which have very tight tolerance ranges for achieving the precision needed in EUV lithography, it is advantageous to have a protective layer with a low elasticity modulus.

It is further advantageous to choose the material of the protective layer, such that the protective layer has a permeation coefficient of less than $10^{-7}$ cm$^2$/bars, preferably less than $10^{-8}$ cm$^2$/bars, to efficiently avoid absorption as well as desorption from the adhesive material of most gases that would be present in EUV or UV lithography apparatuses.

In preferred embodiments, the protective layer 407 is a metallic layer. Advantageously, the metallic layer has a thickness of not more than 10 nm, to not induce too much stress inside bonded parts. Preferably, the metallic protective layer is deposited in a vacuum environment e.g. by sputtering or electron beam or molecular beam epitaxy. Also, chemical vapour deposition at atmospheric pressure is feasible. In particularly preferred embodiments, the metallic protective layer contains aluminium or is made entirely of aluminium. Aluminium is not only readily available and easy to deposit, but also has the advantage that it can be utilized in a high vacuum environment and in the presence of EUV radiation, such as would be present inside EUV lithography apparatuses, without causing contamination.

In other preferred embodiments, the protective layer 407 is a polymer layer. In particularly preferred embodiments, the polymer protective layer contains one or more sily-modified polymers (SMP). Besides providing for protective layers with low elasticity modulus and low permeation coefficients, sily-modified polymers may also be utilized inside EUV lithography apparatuses without large risk of contamination. If the component having a polymer protective layer is to be used in a nitrogen or vacuum environment, advantageously, the polymer is applied in a nitrogen environment and then set in a humid environment, i.e. preferably an environment with a relative humidity of 30% or more. If the component is to be used in an atmospheric gas environment, advantageously the polymer material is applied as well as set in a humid environment, to avoid too large a drift due to expansion or shrinking of the adhesive material over time. In alternative embodiments, that are particularly advantageous for components that are to be utilized as part of or inside an EUV lithography apparatus, the polymer protective layer is also applied in a nitrogen environment. The polymer is then set in an environment with an aggressive gas or in a vacuum environment. Aggressive gases may be e.g. hydrogen or halogens, such as chlorine or fluorine, or their radicals or ions or their combinations. Advantageously, the aggressive gas environment or the vacuum environment is similar to the environment inside the EUV lithography apparatus, in which the component with a protective layer over the adhesive material is to be utilized. The vacuum environment should preferably correspond to the vacuum inside the EUV lithography apparatus during normal operation. The aggressive gas environment should preferably correspond to the environment inside the EUV lithography apparatus during cleaning using e.g. hydrogen or halogens or other gases suited for removing contamination.

FIG. 5 shows schematically a component 500 comprising a scale 501 adhesively bonded to a mask mounting 503 holding a mask 509 with adhesive material 505. To avoid interaction of the adhesive material 505 with the surrounding gas environment, the adhesive material 505 is insulated by the protective layer 507. The scale is used for measuring the position and detecting displacements of the mask mounting 503 optically with help of the probe 508. It will be noted, that the mask 509 may be adhesively bonded to the mask mounting 503 with a protective layer, too.

A comparable component 600 is schematically shown in FIG. 6. There, a scale 601 is adhesively bonded to a wafer mounting 603 holding a wafer 609 with adhesive material 605, but without protective layer. Compared with the component 500 shown in FIG. 5, the adhesive material 605 reacts to a change of the surrounding gas environment, e.g. from atmospheric environment to nitrogen environment by desorption or absorption, causing shrinking or expansion of the adhesive bonding between the wafer mounting 603 and the scale 601. The deformation of the adhesive material leads to a bending of the scale in the direction of the double arrow 602. This bending generates errors when measuring the position or displacement of the wafer mounting 603, because the position of reference marks or lines on the scale varies in an unpredictable way. This is effectively avoided in the component 500 shown in FIG. 5, since the adhesive material 505 is insulated by the protective layer 507. Such a protective layer may be applied e.g. on component 600, of FIG. 6 to protect the adhesive bonding and to avoid stress especially in the scale 601. It will be noted that the wafer 609 may be adhesively bonded to the wafer mounting 603 with a protective layer, too.

Figure 7:
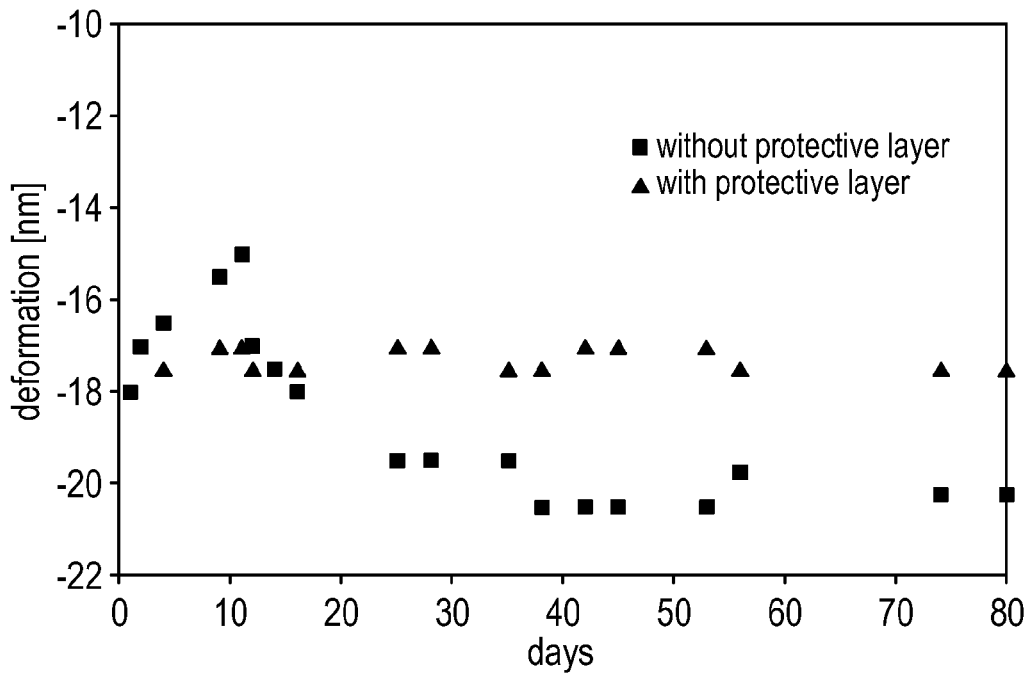
FIG. 7 illustrates the impact of a protective layer on an adhesively bonded EUV mirror.
Figure 8:
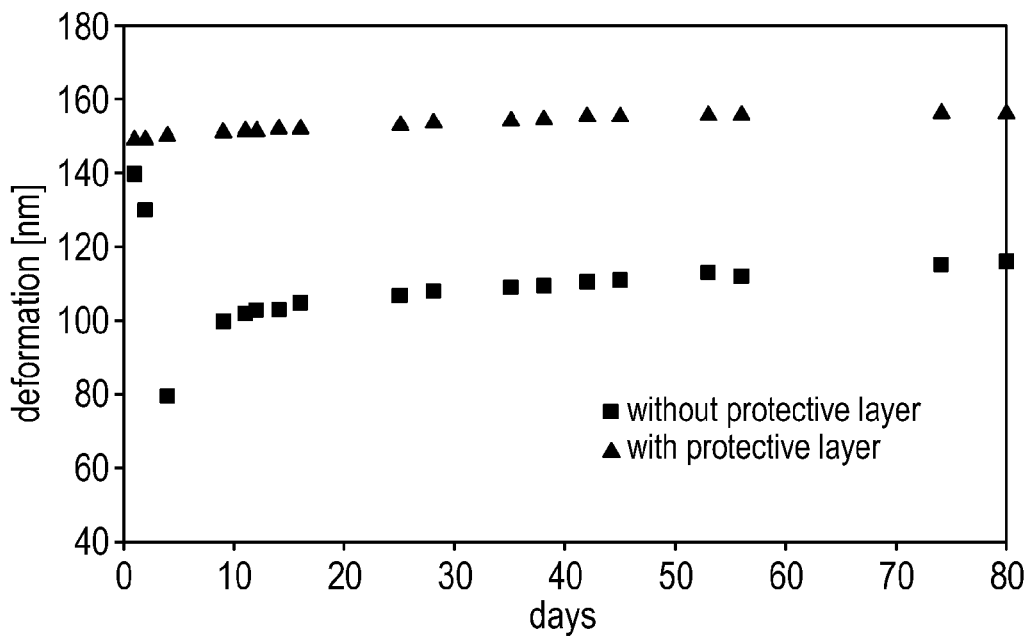
FIG. 8 illustrates the impact of a protective layer on an adhesively bonded UV mirror.

The effect of the protective layer will be more apparent from FIGS. 7 and 8. The deformation of four mirrors was monitored over several days. FIG. 7 shows the deformation of a mirror bonded adhesively to a mounting without protective layer (squares) and the deformation of a mirror bonded adhesively to a mounting with 5 protective layer (triangles), after tempering of the mirrors. In particular, the mirrors were stored in an atmospheric environment with a relative humidity of approximately 40% for the first 10 days. Then, the mirrors were arranged inside an EUV lithography apparatus for operation. Inside the EUV lithography apparatus was a vacuum environment. The mirror deformation was 10 measured with respect to some arbitrary reference. Specifically, the mirror without protective layer showed a large drift of deformation in the humid environment, where it is supposed that the adhesive material absorbed humidity and expanded, as well as in a vacuum environment, where it is supposed that the adhesive material desorbed humidity and shrunk, the mirror with protective layer showed almost no drift of mirror deformation.

FIG. 8 shows also the deformation of a mirror bonded adhesively to a mounting without protective layer (squares) and the deformation of a mirror bonded adhesively to a mounting with protective layer (triangles), after tempering of the mirrors. In particular, the mirrors were stored in an atmospheric environment with a relative humidity of approximately 40% for the 20 first 4 days and then exposed to a vacuum environment on day 5. After that, the mirrors were arranged inside a UV lithography apparatus for operation. Inside the UV lithography apparatus was a nitrogen environment. The mirror deformation was again measured with respect to some arbitrary reference. The mirror without protective layer showed a large drift of deformation in the humid environment, where it is supposed that the adhesive material 25 absorbed humidity and expanded, as well as in a vacuum environment, where it is supposed that the adhesive material desorbed humidity and shrunk. In the nitrogen environment, the adhesive material absorbed some gas and expanded again. The mirror with protective layer, on the other hand, showed almost no drift of mirror deformation.

The above description of preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof

The invention claimed is:

1. A component configured for placement in a gas environment of a lithography apparatus operating with an ultraviolet (UV) or extreme ultraviolet (EUV) wavelength, comprising: a first part and a second part bonded to each other by adhesive material,
    wherein the adhesive material is coated with a protective layer insulating the adhesive material from the gas environment of the lithography apparatus, and
    wherein the protective layer is a polymer layer and has an elasticity modulus of less than 10 MPa.

2. The component according to claim 1, wherein the protective layer has a permeation coefficient of less than $10^{-7}$ cm$^2$/bar·s.

3. The component according to claim 1, wherein the component comprises a scale as the first part and a support as the second part.

4. The component according to claim 1, wherein the component comprises a mirror as the first part and a mirror mounting as the second part.

5. The component according to claim 1, wherein the component comprises a lens as the first part and a lens mounting as the second part.

6. The component according to claim 1, wherein the component comprises a mask as the first part and a mask mounting as the second part.

7. A projection system for an EUV or UV lithography apparatus comprising:
    a component as claimed in claim 1, wherein the first part comprises a lens, a mirror or a mask.

8. An EUV or UV lithography apparatus providing a gas environment and comprising:
   an EUV or UV light source;
   a wafer positioned downstream of the light source;
   a structure positioned between the light source and the wafer and bearing an illuminated pattern that is projected onto the wafer; and
   a component as claimed in claim 1 and positioned in the gas environment between the light source and the wafer.

9. A method for producing a component according to claim 1, comprising:
   bonding the first part to the second part with an adhesive material; and
   depositing a protective layer on the adhesive material while the adhesive material is exposed to the gas environment.

10. The method according to claim 9, wherein the depositing comprises applying a polymer material in a nitrogen environment and setting the polymer material in a humid environment or in an environment with aggressive gases or in a vacuum environment.

11. The method according to claim 9, wherein the depositing comprises depositing a polymer material and setting the polymer material in a humid environment.

12. The method according to claim 9, wherein the protective layer has a permeation coefficient of less than $10^{-7}$ cm$^2$/bar·s.

13. A component configured for placement in a gas environment of a lithography apparatus operating with an ultraviolet (UV) or extreme ultraviolet (EUV) wavelength, comprising: a first part and a second part bonded to each other by adhesive material,
   wherein the adhesive material is coated with a protective layer insulating the adhesive material from the gas environment of the lithography apparatus, and,
   wherein the protective layer is a polymer layer and has a permeation coefficient of less than $10^{-7}$ cm$^2$/bar·s.

14. A projection system for an EUV or UV lithography apparatus comprising a component as claimed in claim 13, wherein the protective layer has an elasticity modulus of less than 2 MPa.

15. An EUV or UV lithography apparatus providing a gas environment and comprising:
   an EUV or UV light source;
   a wafer positioned downstream of the light source;
   a structure positioned between the light source and the wafer and bearing an illuminated pattern that is projected onto the wafer; and
   a component as claimed in claim 13, wherein the protective layer has an elasticity modulus of less than 10 MPa.

16. The component according to claim 13, wherein the protective layer has a permeation coefficient of less than $10^{-8}$ cm$^2$/bar·s.

* * * * *

UNITED STATES PATENT AND TRADEMARK OFFICE
CERTIFICATE OF CORRECTION

| | | |
|---|---|---|
| PATENT NO. | : 9,176,399 B2 | Page 1 of 1 |
| APPLICATION NO. | : 13/360374 | |
| DATED | : November 3, 2015 | |
| INVENTOR(S) | : Hin Yiu Anthony Chung | |

It is certified that error appears in the above-identified patent and that said Letters Patent is hereby corrected as shown below:

In the Specification:
Column 6, Line 36; after "equivalents thereof" insert -- . --

Signed and Sealed this
Seventh Day of June, 2016

Michelle K. Lee
*Director of the United States Patent and Trademark Office*